United States Patent
Yumoto et al.

(10) Patent No.: US 8,889,223 B2
(45) Date of Patent: Nov. 18, 2014

(54) PHYSICAL VAPOR DEPOSITION APPARATUS AND PHYSICAL VAPOR DEPOSITION METHOD

(75) Inventors: Atsushi Yumoto, Tokyo (JP); Naotake Niwa, Tokyo (JP); Fujio Hiroki, Tokyo (JP); Takahisa Yamamoto, Kashiwa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 137 days.

(21) Appl. No.: 13/056,385

(22) PCT Filed: Jul. 28, 2008

(86) PCT No.: PCT/JP2008/063525
§ 371 (c)(1),
(2), (4) Date: Apr. 25, 2011

(87) PCT Pub. No.: WO2010/013304
PCT Pub. Date: Feb. 4, 2010

(65) Prior Publication Data
US 2011/0189390 A1    Aug. 4, 2011

(51) Int. Cl.
C23C 16/00    (2006.01)
C23C 24/04    (2006.01)
C23C 14/22    (2006.01)
C23C 14/06    (2006.01)

(52) U.S. Cl.
CPC ............... C23C 14/22 (2013.01); C23C 24/04 (2013.01); C23C 14/0688 (2013.01); C23C 14/228 (2013.01)
USPC .......................... 427/248.1; 118/715; 118/719

(58) Field of Classification Search
None
See application file for complete search history.

(56) References Cited

U.S. PATENT DOCUMENTS

2005/0281948 A1*  12/2005  Grace et al. ................. 427/248.1
2007/0042178 A1*  2/2007   Sachweh et al. .............. 428/336
2008/0257723 A1*  10/2008  Yumoto et al. ............ 204/298.07

FOREIGN PATENT DOCUMENTS

| JP | 2003-277948 |   | 10/2003 |
| JP | 2006-045616 |   | 2/2006  |
| JP | 2006-111921 |   | 4/2006  |
| JP | 2008-195996 |   | 8/2008  |
| WO | WO2006-041160 | * | 4/2006 |

OTHER PUBLICATIONS

Yumoto, Abstract of Meeting, Jun. 5, 2007—English translation of paragraph 3.*
Yumoto—partial English translation of Abstracts of Spring Meeting of Japan Society of Powder and Powder Metatllurgy, Jun. 2007.*

(Continued)

Primary Examiner — Joseph Miller, Jr.
(74) Attorney, Agent, or Firm — DLA Piper LLP (US)

(57) ABSTRACT

A physical vapor deposition apparatus and a physical vapor deposition method for forming a film of a substance which is hard to be made fine particles even when it is heated by plasma, arc discharge, or the like are provided. It has an evaporation chamber 10 provided inside it with an evaporation source material 15 and a heating part 16 for heating the evaporation source material 15, a powder supply source 20 provided inside it with a powder, and a film forming chamber 30, wherein the evaporation source material 15 is heated by the heating part 16 to produce fine particles (nanoparticles), the fine particles and powder are sprayed out of a supersonic nozzle 35, are placed on a supersonic gas stream, and are deposited on a substrate for film formation 33 by physical vapor deposition.

4 Claims, 10 Drawing Sheets

(56) References Cited

OTHER PUBLICATIONS

English Abstract of JP 2006-045616 published Feb. 16, 2006.
English Translation of JP 2006-045616 published Feb. 16, 2006.
English Abstract of JP 2008-195996 published Aug. 28, 2008.
English Translation of JP 2008-195996 published Aug. 28, 2008.
English Abstract of JP 2003-277948 published Oct. 2, 2003.
English Translation of JP 2003-277948 published Oct. 2, 2003.
English Abstract of JP 2006-111921 published Apr. 27, 2006.
English Translation of JP 2006-111921 published Apr. 27, 2006.
International Search Report issued in PCT/JP2008/063525 on Oct. 21, 2008.
Atsushi Yumoto et al., "Choonsoku Free Jet PVD ni yoru Hydroxyapatite Ryushi Bunsan Ti-maku no Keisei", Abstracts of Meeting of Japan Society of Powder and Powder Metallurgy Heisei 19 Nendo Shunki Taikai, Jun. 5, 2007; p. 200.
Atsushi Yumoto et al., "Choonsoku Free Jet PVD ni yoru Apatite Bunsen Ti-maku no Keisei", Dai 87 Kai 2008 Nen Shunki Zenkoku Koen Taikai Ronbunshu, Japan Thermal Spraying Society, Jun. 2, 2008, pp. 31 to 32.
Naotake Niwa, "Choonsoku Free Jet PVD", Materials Science & Technology, Jun. 1, 2008, vol. 78, No. 6, pp. 65 to 70.
A. Yumoto et al., In Situ Synthesis of Titanium-Aluminides in Coating with Supersonic Free-Jet PVD Using Ti and Al Nanoparticles, Surface and Coatings Technology, 169-170, 2003, 499 to 503.
A. Yumoto et al., Formation of Ti and Al Films by Supersonic Free Jet PVD, The Journal of the Japan Institute of Metals, vol. 65, No. 7, 2001, pp. 635-643.
Keijiro Yamamoto et al., Oscillation Phenomenon of Coaxial Impinging Jets, Hydraulics and Pneumatics, 1975, pp. 68-77.

* cited by examiner

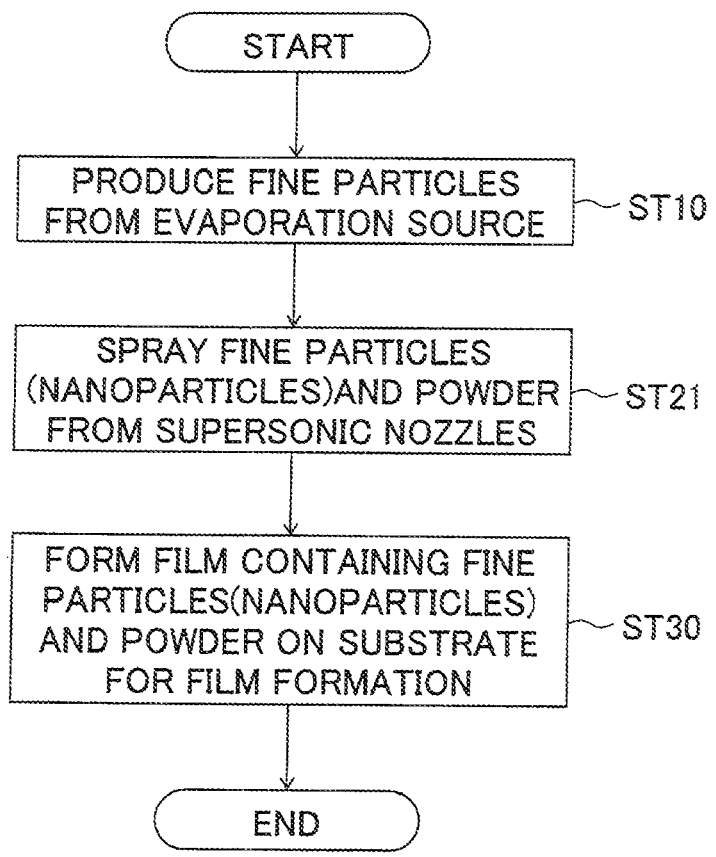

FIG. 8A
FIG. 8B
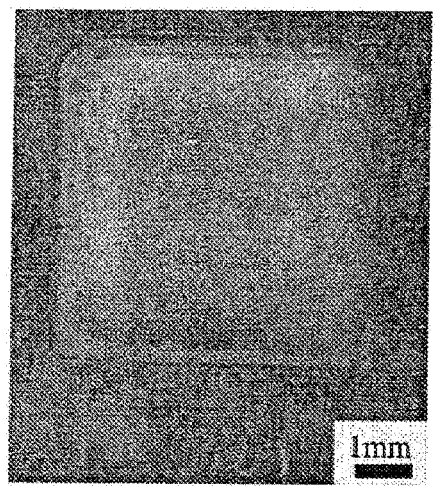
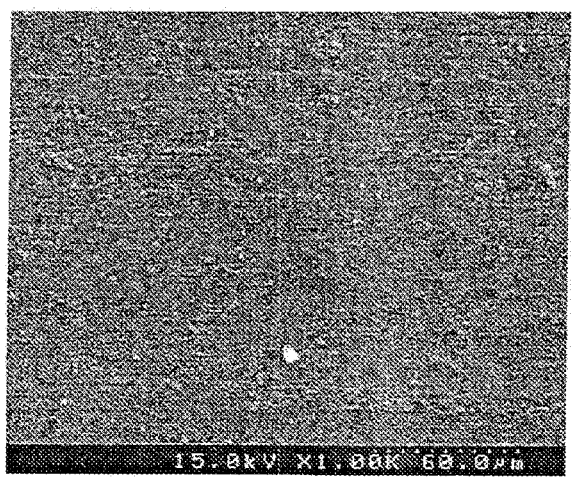

PHYSICAL VAPOR DEPOSITION APPARATUS AND PHYSICAL VAPOR DEPOSITION METHOD

TECHNICAL FIELD

The present invention relates to a physical vapor deposition apparatus and a physical vapor deposition method, more particularly relates to a physical vapor deposition apparatus which mixes fine particles produced by atoms which have been evaporated from an evaporation source material with a powder and deposits the result on a substrate for film formation and to physical vapor deposition method of the same.

BACKGROUND ART

In recent years, coating technology has been rapidly rising in importance. Various coating methods are being developed.

However, a coating method capable of constructing a high density coating film having a thickness of about tens to hundreds of micrometers has not been known.

The document A. Yumoto, F. Hiroki, I. Shiota, N. Niwa, Surface and Coatings Technology, 169-170, 2003, 499 to 503 and the document Atsushi Yumoto, Fujio Hiroki, Ichiro Shiota, Naotake Niwa, Formation of Ti and Al Films by Supersonic Free Jet PVD, The Journal of the Japan Institute of Metals, Vol. 65, No. 7 (2001) pp. 635 to 643 disclose supersonic free jet (SFJ) physical vapor deposition (PVD) apparatuses.

Such an SFJ-PVD apparatus is provided with an evaporation chamber and a film forming chamber.

In the evaporation chamber, an evaporation source material which is set on a hearth which is cooled by water and an electrode which is made of a high melting point metal (specifically tungsten) are provided. The interior of the evaporation chamber is once reduced to a predetermined pressure then the atmosphere is substituted with a predetermined gas atmosphere. Using the evaporation source material as an anode and a high conductive metal which is located at a position which is spaced from the anode with a constant distance as a cathode, a negative voltage and a positive voltage are applied to induce an arc discharge between the two electrodes. Due to this transfer type arc plasma, the evaporation source material is heated and evaporated. In an evaporation chamber made a predetermined gas atmosphere, atoms which are evaporated by heating of the evaporation source material agglomerate with each other whereby fine particles having sizes of the nanometer order (hereinafter referred to as "nanoparticles") are obtained.

The obtained nanoparticles ride a gas flow induced due to a pressure difference (difference of degree of vacuum) between the evaporation chamber and the film forming chamber so as to be transported through a transport pipe to the film forming chamber. In the film forming chamber, a substrate for film formation is provided.

The gas flow due to the pressure difference is accelerated up to a supersonic speed of about Mach 3.6 by a specially designed supersonic nozzle (Laval nozzle) which is attached to a front end of the transport pipe connected from the evaporation chamber to the film forming chamber. The nanoparticles ride the air current of the supersonic free jet and are accelerated to a high speed and sprayed to the film forming chamber to be deposited on the substrate for film formation.

By using the SFJ-PVD apparatus described above, it becomes possible to construct a high density coating film having tens to hundreds of micrometers of thickness at a low temperature.

Here, the object of forming a film on the surface of the film formation object is the protection of the surface of the film formation object, insulation of the film formation object, and so on. It has been desired that the material for forming the film have characteristics such as excellent heat resistance, chemical stability, and toughness.

Accordingly, in order to improve the above characteristics of the film which is formed on the surface of the film formation object, for example, there is known the physical vapor deposition apparatus disclosed in Japanese Patent Publication (A) No. 2006-111921 wherein first fine particles and second fine particles are produced in two evaporation chambers, are mixed by utilizing an oscillation phenomenon of coaxial impinging jets described in the document Keijiro Yamamoto, Akira Nomoto, Tadao Kawashima, and Nobuaki Nakaji, Oscillation Phenomenon of Coaxial Impinging Jets, Hydraulics and Pneumatics (1975) pp. 68 to 77, and are made to ride on a supersonic gas flow to be made to deposit on the substrate by physical vapor deposition.

DISCLOSURE OF INVENTION

Technical Problem

However, a material which is excellent in heat resistance and is chemically stable is hard to evaporate, therefore film formation by the vapor deposition method was difficult in comparison with the other materials. For example, a substance, like a ceramic, which has heat resistance is hard to be made into fine particles even when it is heated by plasma, arc discharge, or the like. Film formation of such a substance by plasma, arc discharge, etc. is difficult in comparison with other materials. Further, ceramic by nature has a weak adhesive power to a substrate, is easily peeled off, is brittle, and is easily broken when it is formed on a substrate as a thin film. A stable film could not be formed.

Accordingly, an object of the present invention is to provide a physical vapor deposition apparatus and a physical vapor deposition method for formation of a film of a substance which is hard to form into fine particles even when it is heated by plasma, arc discharge, or the like.

Further, an object is to provide a physical vapor deposition apparatus and a physical vapor deposition method for mixing a material, which would exhibit brittleness if it were used solo to form a film, with another material so as to form a film.

Further, an object is to provide an inexpensive physical vapor deposition apparatus and physical vapor deposition method which enables film formation without the use of a plurality of vacuum vessels and heating devices when mixing a plurality of materials to form a film.

Technical Solution

A physical vapor deposition apparatus of the present invention includes: an evaporation chamber which is provided inside therein with an evaporation source material and a heating part for heating the evaporation source material, which heats the evaporation source material by the heating part under a predetermined gas atmosphere or air atmosphere to evaporate it, and which produces fine particles from evaporated atoms; a powder supply source which is provided inside thereof with a powder; and a film forming chamber which is provided inside thereof with a mixing part which is connected to transport pipes which form paths for transporting a gas which contains the fine particles from the evaporation chamber and for transporting a gas containing the powder from the powder supply source and which mixes the fine particles and the powder, a supersonic nozzle which is connected to the mixing part, and a substrate for film formation, which makes the fine particles and the powder transported from the evaporation chamber and the powder supply source ride an a supersonic gas stream created by the supersonic nozzle, and which deposits the fine particles and the powder on the substrate for film formation by physical vapor deposition.

The above physical vapor deposition apparatus of the present invention preferably uses fine particles made of metal as the fine particles and uses a powder made of ceramic as the powder.

Further, the physical vapor deposition method of the present invention described above includes: a production step of heating and evaporating an evaporation source material in a predetermined gas atmosphere or the air atmosphere by a heating part which evaporates the evaporation source material to produce fine particles from evaporated atoms, a mixing step of transporting the fine particles and the powder from the powder supply source to a mixing part and mixing the fine particles and the powder in the mixing part, and a film forming step of making the mixed fine particles and powder ride a supersonic gas stream created by a supersonic nozzle connected to the mixing part, depositing this on the substrate for film formation by physical vapor deposition, and forming a film containing the fine particles and the powder.

The above physical vapor deposition method of the present invention preferably uses fine particles made of metal as the fine particles and uses a powder made of ceramic as the powder.

Further, a physical vapor deposition apparatus of the present invention includes: an evaporation chamber which is provided inside thereof with an evaporation source material and a heating part for heating the evaporation source material, which heats the evaporation source material by the heating part under a predetermined gas atmosphere or air atmosphere to evaporate the same, and which produces fine particles from evaporated atoms; a powder supply source which is provided inside thereof with a powder; and a film forming chamber which is provided inside thereof with a first supersonic nozzle which is connected to a transport pipe which forms a path for transporting a gas containing the fine particles from the evaporation chamber, a second supersonic nozzle which is connected to a transport pipe which forms a path for transporting a gas containing the powder from the powder supply source, and a substrate for film formation, which makes the fine particles which were transported from the evaporation chamber ride a supersonic gas stream which is created by the first supersonic nozzle, which makes the powder which was transported from the powder supply source ride a supersonic gas stream which is created by the second supersonic nozzle, and which deposits the fine particles and the powder on the substrate for film formation by physical vapor deposition.

The above physical vapor deposition apparatus of the present invention preferably uses fine particles made of metal as the fine particles and uses a powder made of ceramic as the powder.

Further, the physical vapor deposition method of the present invention described shove includes: a production step of heating and evaporating an evaporation source material in as predetermined gas atmosphere or the air atmosphere by a heating part for evaporating the evaporation source material and producing fine particles from evaporated atoms and a film forming step of transporting the fine particles and placing these on a supersonic gas stream created by a supersonic nozzle, transporting the powder from the powder supply source and placing it on a supersonic gas stream created by a supersonic nozzle different from the previously described supersonic nozzle, and depositing the fine particles an the powder on a substrate for film formation by physical vapor deposition to form a it containing the fine particles and the powder.

Advantageous Effects

According to the present invention, there is provided a physical vapor deposition apparatus and a physical vapor deposition method, for forming a film of a substance which is hard to be made into fine particles even when it is heated by plasma, arc discharge, the like.

Further, according to the present invention, there can be provided a physical vapor deposition apparatus and a physical vapor deposition method, for forming a film by mixing a substance, which would exhibit brittleness if it were used solo to form a film, with another substance.

Further, according to the present invention, there can be provided an inexpensive physical vapor deposition apparatus and physical vapor deposition method, capable of forming a film without using a plurality of vacuum vessels and heating devices when a film is formed by mixing a plurality of materials.

BRIEF DESCRIPTION OF DRAWINGS

FIG. 1 is a schematic view of the configuration of a physical vapor deposition apparatus according to a first embodiment of the present invention.

FIG. 2 is a view showing an arc torch which configures part of the physical vapor deposition apparatus according to the first embodiment of the present invention.

FIG. 3 is a schematic view of a mixing device which utilizes an oscillation phenomenon of coaxial impinging jets in the first embodiment of the present invention.

FIG. 4 is a flow of a physical vapor deposition method in the first embodiment of the present invention.

FIG. 5 is a cross-sectional view showing a cross-section of a film manufactured by the physical vapor deposition apparatus in the first embodiment of the present invention.

FIG. 6 is a schematic view of the configuration of a supersonic free jet physical vapor deposition apparatus for forming a metal film in which hydroxyapatite particles are dispersed according to a second embodiment of the present invention.

[FIG. 7] FIG. 7 is a flow of a physical vapor deposition method in the second embodiment of the present invention.

[FIG. 8] FIG. 8A and FIG. 8B are electron micrographs according to Example 1.

[FIG. 9]

[FIG. 10]

EXPLANATION OF REFERENCES

10 . . . evaporation chamber, 11 . . . exhaust pipe, 12 . . . mass flow control, 13 . . . gas supply source, 14 . . . crucible, 15 . . . evaporation source material, 16 . . . heating part, 17, 27 . . . transport pipes, 20 . . . powder supply source, 30 . . . film forming chamber, 31 . . . exhaust pipe, 32 . . . stage, 33 . . . substrate for film formation, 34 . . . mixing part, 35, 36, 37 . . . supersonic nozzles, 50 . . . arc torch, 51 . . . torch electrode, 60 . . . binder, 61 . . . powder, 70 . . . first mixing nozzle, 71 . . . first extrusion port, 72 . . . first jet, 80 . . . second mixing nozzle, 81 . . . second extrusion port, 82 . . . jet, 90, 91 . . .

partition plates, 92, 93 ... opening portions, 94, 95 ... mixed fluids, 96 ... merged fluid, 100 ... powder, 101 ... fine particle material film, ARC ... arc, T1 ... first fluid supply tube, T2 ... second fluid supply tube, VP1, VP2, VP3 ... vacuum pumps, MR ... mixing region, and J, J1, J2 ... air currents of supersonic free jets.

Best Mode for Carrying out the Invention

Embodiments of a physical vapor deposition apparatus according to the present invention will be explained with reference to the drawings.

First Embodiment

Figure 1:
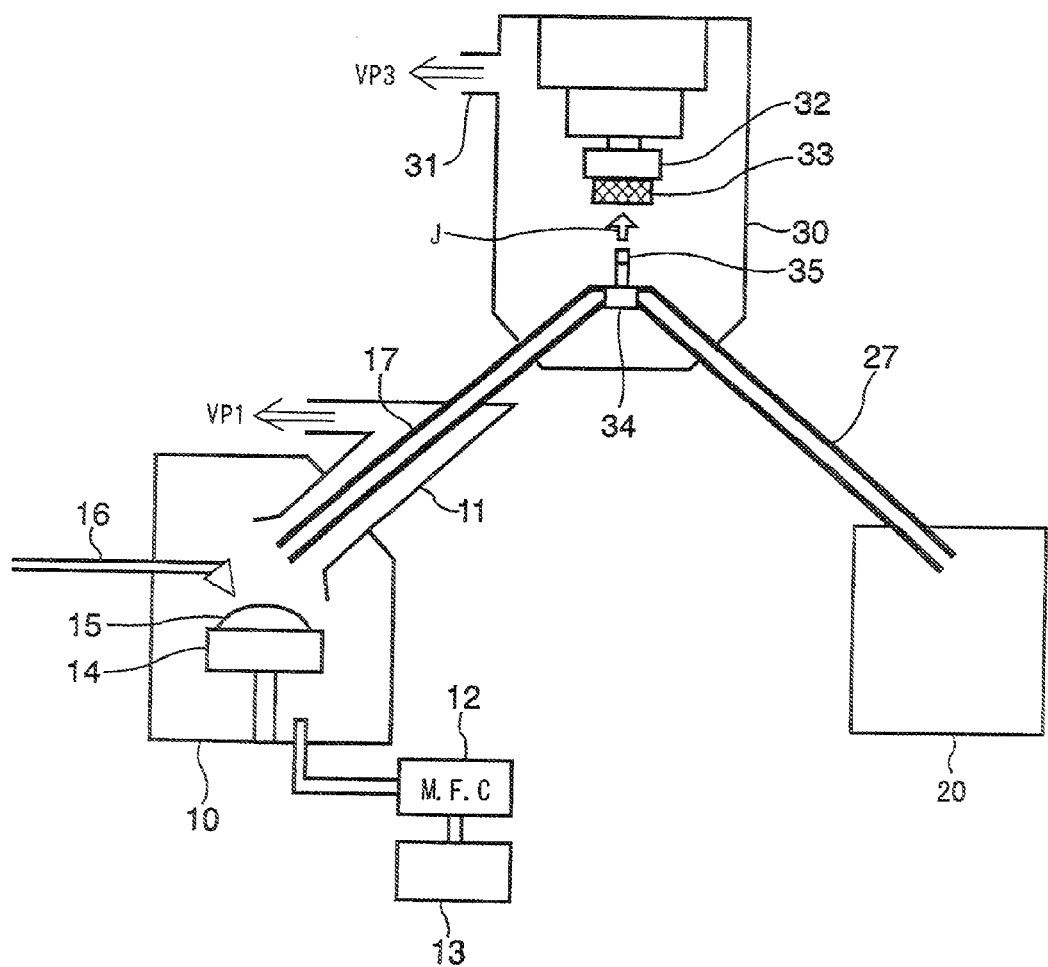
[FIG. 1]

FIG. 1 is a schematic view of the configuration of a physical vapor deposition (PVD) apparatus according to the present embodiment comprised of an SFJ-PVD apparatus.

The PVD apparatus of the present embodiment is provided with an evaporation chamber 10, a powder supply source 20, and a vacuum chamber for film formation comprised of a film forming chamber 30.

In the evaporation chamber 10, an exhaust pipe 11 connected to a vacuum pump VP1 is provided. The interior of the first evaporation chamber 10 is evacuated by operation of the vacuum pump V1 and is made an ultra-high vacuum atmosphere of for example about 10-10 Torr. Further, according to need, He, N2, or another inert gas is supplied into the evaporation chamber 10 with a predetermined flow rate from a gas supply source 13 which is provided at the evaporation chamber 10 through a mass flow controller 12. Alternatively, the interior may be made air atmosphere as well.

In the evaporation chamber 10, a copper crucible 14 which is cooled by water is provided. In this, an evaporation source material 15 is charged. In the vicinity of the evaporation source material 15, a heating part 16 for heating the evaporation source material 15 is provided. The evaporation source material 15 is heated by the heating part 15 to evaporate, whereby fine particles which have sizes of the nanometer order (hereinafter, also referred to as "nanoparticles") are obtained from atoms which are evaporated from the evaporation source material 15.

The obtained nanoparticles are transported together with the atmospheric gas in the evaporation chamber 10 through a transport pipe 17 to the film forming chamber 30.

In the powder supply source 20, a powdery material (hereinafter, also referred to as a powder) is contained. The pressure inside the vessel which configures part of the powder supply source 20 is not particularly limited, but preferably the pressure is made that of the air atmosphere from a viewpoint of operability.

A commercially available powder material can be used as the above powder. The powder has a particle size of for example not more than several tens of micrometers, preferably, for example, about 5 to 10 μm.

Then, the powder is stirred up in the vessel by for example making the vessel of the powder supply source 20 vibrate. The stirred up powder is transported together with the inert gas in the vessel to the film forming chamber 30 through the transport pipe 27.

In the film forming chamber 30, an exhaust pipe 31 connected to a vacuum pump VP3 is provided. The interior or the film forming chamber 30 is evacuated by operation of the vacuum pump V3 and is made an ultra-high vacuum atmosphere of for example about 10-10 Torr.

In the film forming chamber 30, a stage 32 driven in an X-Y direction is provided. A substrate for film formation 33 is fixed on this stage 32.

The substrate for film formation is not particularly limited. However, use can be made of for example a pure titanium sheet (JIS grade 1), A1050 aluminum alloy sheet, and SUS304 stainless steel sheet. The substrate for film formation is preferably used after cleansing by supersonic waves in acetone before setting in the film forming chamber.

A mixing part 34 is provided at a merged portion of the front end of the transport pipe 17 from the evaporation chamber 10 and the front end of the transport pipe 27 from the powder supply source 20. A supersonic nozzle 35 (Laval nozzle) is provided so as to extend from the center portion of the mixing part 34. On the outer periphery of each transport pipe (17, 27) on the side by the mixing part 34, a not shown coil heater may be provided to enable heating.

When nanoparticles are produced in the above evaporation chamber 10, the powder is set in the powder supply source 20, and the interior of the film forming chamber 30 is evacuated by operation of the vacuum pump V3, a flow of gas occurs due to a pressure difference between the evaporation chamber 10 and powder supply source 20 and the film forming chamber 30. The nanoparticles and powder are transported together with the inert gas through the transport pipes to the film forming chamber 30.

A first fluid containing nanoparticles and a second fluid containing a powder are mixed in the mixing part 34 and sprayed from the supersonic nozzle (Laval nozzle) 35 attached to the center portion of the mixing part 34 as a supersonic gas stream (stream of supersonic free jet) J toward the substrate for film formation 33 in the film forming chamber 30.

The supersonic nozzle 35 is designed based on one-dimensional or two-dimensional compressible fluid dynamics in accordance with the type and composition of the gas and an exhaust capability of the film forming chamber and is connected to the front end of the transport pipe or formed integrally with the front end portion of the transport pipe. Specifically, it is a reduced/extended diameter tube obtained by changing the diameter of the inside of the nozzle and can raise the gas stream induced due to a pressure difference between the evaporation chamber and the film forming chamber up to as supersonic speed of for example Mach 1.2 or more.

The nanoparticles and powder are for example accelerated up to a supersonic speed of about Mach 3.6 by the supersonic nozzle 35, ride the supersonic gas stream, are sprayed toward the substrate for film formation 33 in the film forming chamber 30, and are deposited on the substrate for film formation 33 (physical vapor deposition).

Next, the heating part 16 for heating the evaporation source material 15 will be explained.

Figure 2:
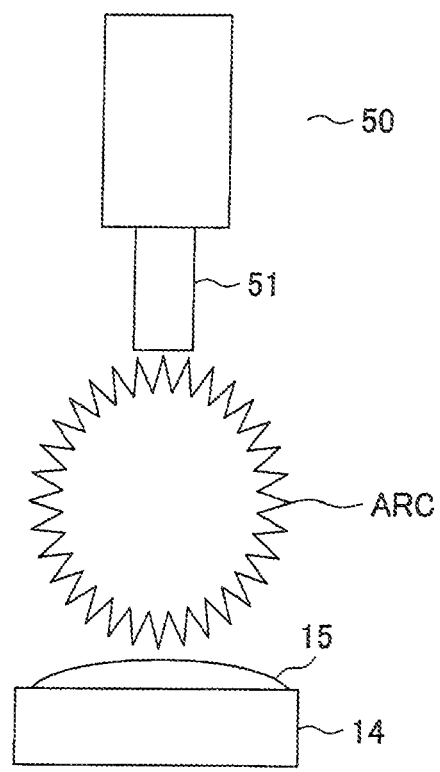
[FIG. 2]

FIG. 2 is a view showing an arc torch configuring part of the physical vapor deposition apparatus according to the present embodiment.

In the present embodiment, the heating part 16 uses an arc torch 50 to evaporate the evaporation source material 15.

As shown in FIG. 2, the arc torch 50 has a torch electrode 51 at its front end portion. It may have a not shown torch electrode holder as well. For the torch electrode 51, use can be made of for example tungsten, stainless steel, or another metal. Further, the current which is run to the torch electrode 51 is a DC current, DC pulse current, AC current, AC pulse current etc. It is preferably a DC current.

Further, the evaporation source material 15 is made an anode, the torch electrode 51 is made a cathode, for example a DC current is run to the two electrodes to cause discharge, the evaporation source material 15 is heated and evaporated by the generated arc, and fine particles having sizes of the nanometer order (hereinafter, also referred to as "nanoparticles") are obtained from atoms evaporated from the evaporation source material 15.

In the present embodiment, as the heating part 16, the arc torch 50 was explained. However, the part is not limited to this. For example, it is also possible to use a plasma torch to generate plasma and thereby heat the evaporation source material 15. Further, other than this, it is possible to use a heating device able to heat and evaporate the evaporation source material 15.

Next, a mixing part 34 will be explained.

The mixing part 34 is coupled with the transport pipe 17 and the transport pipe 27. In the mixing part 34, the first fluid which is transported from the transport pipe 17 and contains nanoparticles and the second fluid which is transported from the transport pipe 27 and contains the powder are mixed.

The mixing part 34 may be a mixing device able to uniformly mix the first fluid and the second fluid. The structure is not particularly limited. For example, it may be a mixing device performing mixing by utilizing an oscillation phenomenon of coaxial impinging jets shown in FIG. 3 as well.

Figure 3:
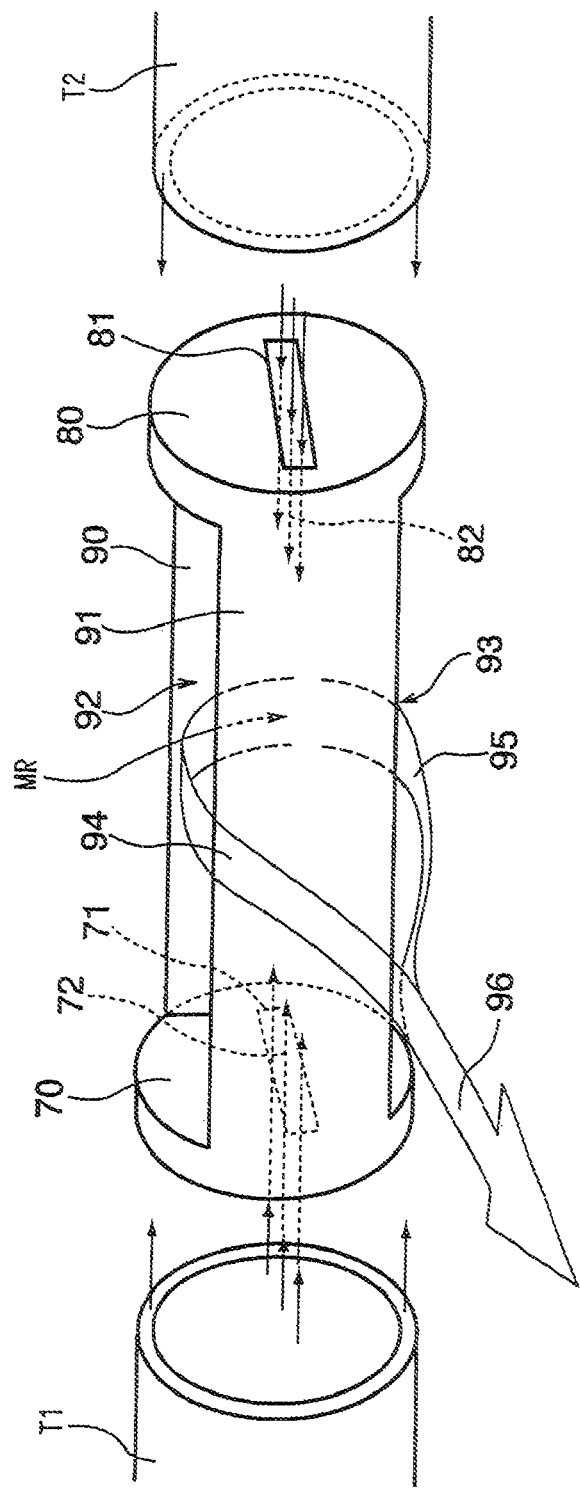
[FIG. 3]

In FIG. 3, a disk-state first mixing nozzle 70 having a substantially rectangular shaped first extrusion port 71 and a disk-state second mixing nozzle 80 having a substantially rectangular shaped second extrusion port 81 are connected so as to be bridged by a pair of partition plates (90, 91).

A space between the first extrusion port 71 and the second extrusion port 81 becomes a mixing region MR for mixing the first jet of the first fluid and the second jet of the second fluid.

The first mixing nozzle 70, second mixing nozzle 80, and a pair of partition plates (90, 91) are for example integrally formed. They are formed from for example brass, stainless steel, or another material by using a wire cut electrodischarge machine equipped with NC or the like. Alternatively, for example, ones formed for parts may be assembled as well.

The shapes of the first extrusion port 71 and second extrusion port 81 preferably become ones so that or example the lengths of the short sides are up to about several millimeters, the lengths of the long sides are about several to ten plus millimeters, and aspect ratios of the lengths of the short sides and the lengths of the long sides are 4 to 6.

Further, the inter-nozzle distance between the first extrusion port 71 of the first mixing nozzle 70 and the second extrusion port 81 of the second mixing nozzle 80 is preferably for example a distance of 4 to 35 times the lengths of the short sides of the substantially rectangular shapes of the first extrusion port 71 and second extrusion port 81.

For example, the lengths of the short sides of the substantially rectangular shapes of the first extrusion port 71 and second extrusion port 81 are about 1 mm, the lengths of the long sides are about 4 mm, the aspect ratios are 4, and the inter-nozzle distance is 16 mm.

Further, a pair or partition plates (90, 91) are provided so that the distance between the two is substantially equal to the lengths of the long sides of the substantially rectangular shapes of the first extrusion port 71 and second extrusion port 81.

For example, a first fluid supply tube T1 is connected to the surface of the first mixing nozzle 70 on the side opposite to the mixing region MR. On the other hand, a second fluid supply tube T2 is connected to the surface of the second mixing nozzle 80 on the side opposite to the mixing region MR.

Here, the first fluid containing nanoparticles is supplied from the first fluid supply tube T1, and the second fluid containing the powder is supplied from the second fluid supply tube T2. The first fluid becomes a first jet 72 and is sprayed from the first extrusion port 71 to the mixing region MR.

Further, the second fluid becomes a second jet 82 and is sprayed from the second extrusion port 81 to the mixing region MR. The first fluid and second fluid are mixed in the mixing region MR due to the oscillation phenomenon of coaxial impinging jets.

The mixed fluids (94, 95) begin to flow from opening portions (92, 93) facing the mixing region MR to the outside of the mixing region MR. Further, they flow as for example, a merged fluid 96, to the supersonic nozzle.

Here, as pressures of the fluids supplied by the first fluid supply tube T1 and second fluid supply tube T2 and the pressure of the mixing region before spraying the fluids, for example, pressures of the fluids supplied by the first fluid supply tube T1 and the second fluid supply tube T2 are set to 60 to 90 kPa, the pressure of the mixing region before spraying the fluids is set to 0.5 to 2 kPa, and a pressure ratio between the upstream and the downstream sides of the spray port is set to for example about 45.

It is possible to confirm the situation of mixing of the first fluid and second fluid described above by observing, for example, vibration of pressure in the mixing region of the mixing part.

The mixing part 34 is not limited to a mixing device utilizing the oscillation phenomenon of the coaxial impinging jets, but may be a mixing device able to uniformly mix nanoparticles and a powder. For example, it may be a for example Y-shaped fluid mixing device or other mixing device mechanically controlling inflow of fluid into a takeout port by using electric energy from the outside.

Below, a physical vapor deposition method in the present embodiment according to the present invention will be explained.

Figure 4:
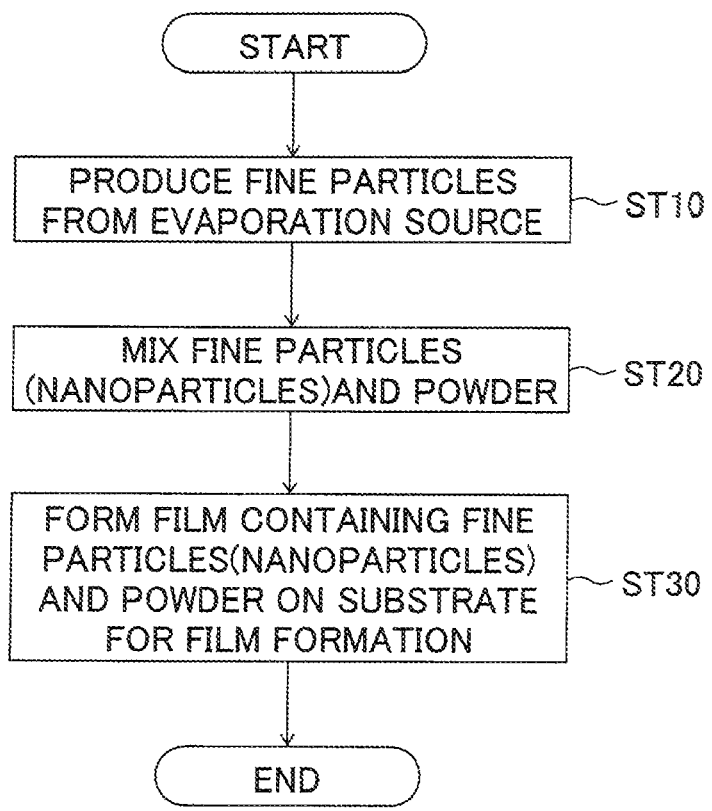
[FIG. 4]

FIG. 4 is a flow chart of the physical vapor deposition method in the present embodiment according to the present invention.

Fine particles (nanoparticles) are produced from the evaporation source material (ST10).

The crucible 14 is provided in the evaporation chamber 10, while the evaporation source material 15 is charged in this. Then, in the vicinity of the evaporation source material 15, the heating part 16 comprised of an arc torch is provided. By making this crucible 14 an anode electrode and making the arc torch a cathode electrode and running a DC current, an arc is generated due to discharge between the two electrodes. The evaporation source material 15 is evaporated by that heat. By evaporation of the evaporation source material 15, the evaporation source material 15 becomes atoms, and nanoparticles are generated from these atoms.

Next, the fine particles (nanoparticles) and powder are mixed (ST20).

The nanoparticles produced at step ST10 are transported from the inside of the evaporation chamber through the transport pipe 17 to the mixing part 34. Further, the powder supply source 20 contains the powder. The powder is stirred up in the vessel by for example making the vessel of the powder supply source 20 vibrate.

Then, the stirred up powder passes through the transport pipe 27 and is transported to the mixing part 34. The nanoparticles and powder transported to the mixing part 34 are mixed in the mixing part 34.

Next, the fine particles (nanoparticles) and powder are deposited on the substrate for film formation to form a film (ST30).

The gas of the mixture of the nanoparticles and powder, i.e., the nanoparticles and powder mixed in the mixing part 34, are sprayed from the supersonic nozzle provided in the center portion of the mixing part 34 into the film forming chamber 30. At this time, the interior of the film forming chamber 30 is an ultra-high vacuum atmosphere. Therefore, these are sprayed from the supersonic nozzle 35 due to the pressure difference between the mixing part 34 and the film forming chamber 30. The sprayed gas impinges the substrate for film formation 33, whereupon the nanoparticles and powder are deposited on the substrate for film formation 33 to form a film.

Next, a dispersion film manufactured by the physical vapor deposition apparatus and the physical vapor deposition method in the present embodiment will be explained.

Figure 5:
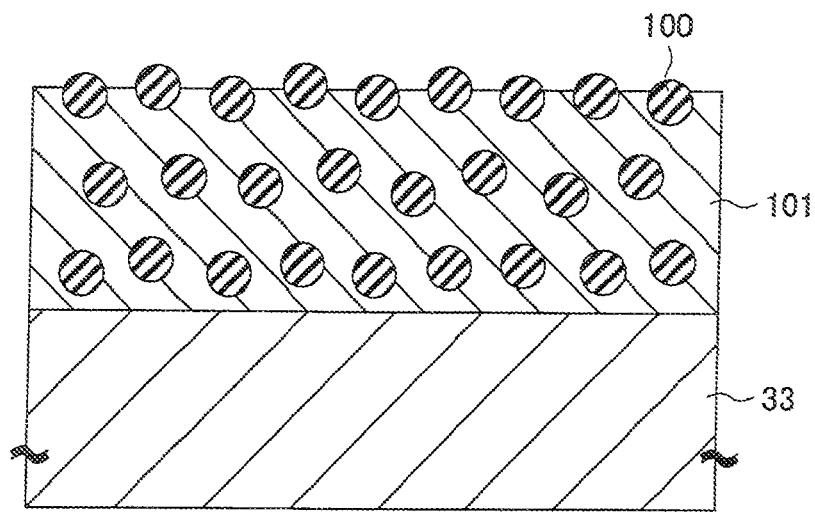
[FIG. 5]

FIG. 5 is a cross-sectional view showing a cross-section of a dispersion film manufactured by the physical vapor deposition apparatus and physical vapor deposition method in the present embodiment.

As shown in FIG. 5, the dispersion film manufactured by the physical vapor deposition apparatus in the present embodiment is comprised of a powdery material comprised of the powder 100 and a material of fine particles performing a role as a binder comprised of a fine particle material film 101.

In the present embodiment, as the fine particles produced from the evaporation source material 15, use can be made of for example a metal, while as the powder-state material, for example a ceramic can be used.

As the metal of the evaporation source material 15, there can be mentioned for example Ti, Al, Cr, Fe, Ni, Cu, etc. As the powder-state material, there can be mentioned, for example, hydroxyapatite ($Ca_{10}(PO_4)_6(OH)_2$), molybdenum disulfide ($MoS_2$), titanium oxide ($TiO_2$), titanium nitride (TiN), chromium nitride (CrN), silicon carbide (SiC), boron nitride (BN), diamond-like carbon (DLC), carbon nanotubes, etc.

Here, when the powder 100 is a ceramic, if it is used solo to form a film, the strength of the film becomes high, but there is the possibility of the film exhibiting a fragile nature. For this reason, it is possible to mix it with fine particles of metal to form a film and thereby make the metal perform the role of a binder and form a film having a strength of the ceramic and having a lowered fragile nature. For example, a dispersion film formed by dispersion of hydroxyapatite ($Ca_{10}(PO_4)_6(OH)_2$) in a metal film has a higher bioaffinity than metal, so can be utilized as a bone substitute.

An explanation was given on the dispersion film manufactured in the present embodiment by using a metal as fine particles produced from the evaporation source material 15 and using a ceramic as the powder-state material, but the invention is not limited to these. A film can be formed by using various materials which can be deposited by physical vapor deposition by using the physical vapor deposition apparatus of the present invention.

According to the physical vapor deposition apparatus and method of the present embodiment, a substance which is hard to form into fine particles even when it is heated by plasma, arc discharge, or the like can be processed to form a film.

Further, according to the physical vapor deposition apparatus and method of the present embodiment, a film can be formed by mixing a substance, which would exhibit brittleness if forming a film solo, with another substance.

Further, according to the physical vapor deposition apparatus and method of the present embodiment, when forming a film by mixing a plurality of materials, the film can be formed without using a plurality of vacuum vessels and heating devices.

Second Embodiment

A physical vapor deposition apparatus and method of the present embodiment will be explained next.

A dispersion film formed by the physical vapor deposition apparatus and method according to the present embodiment has substantially the same configuration as that of the first embodiment shown in FIG. 5.

Figure 6:
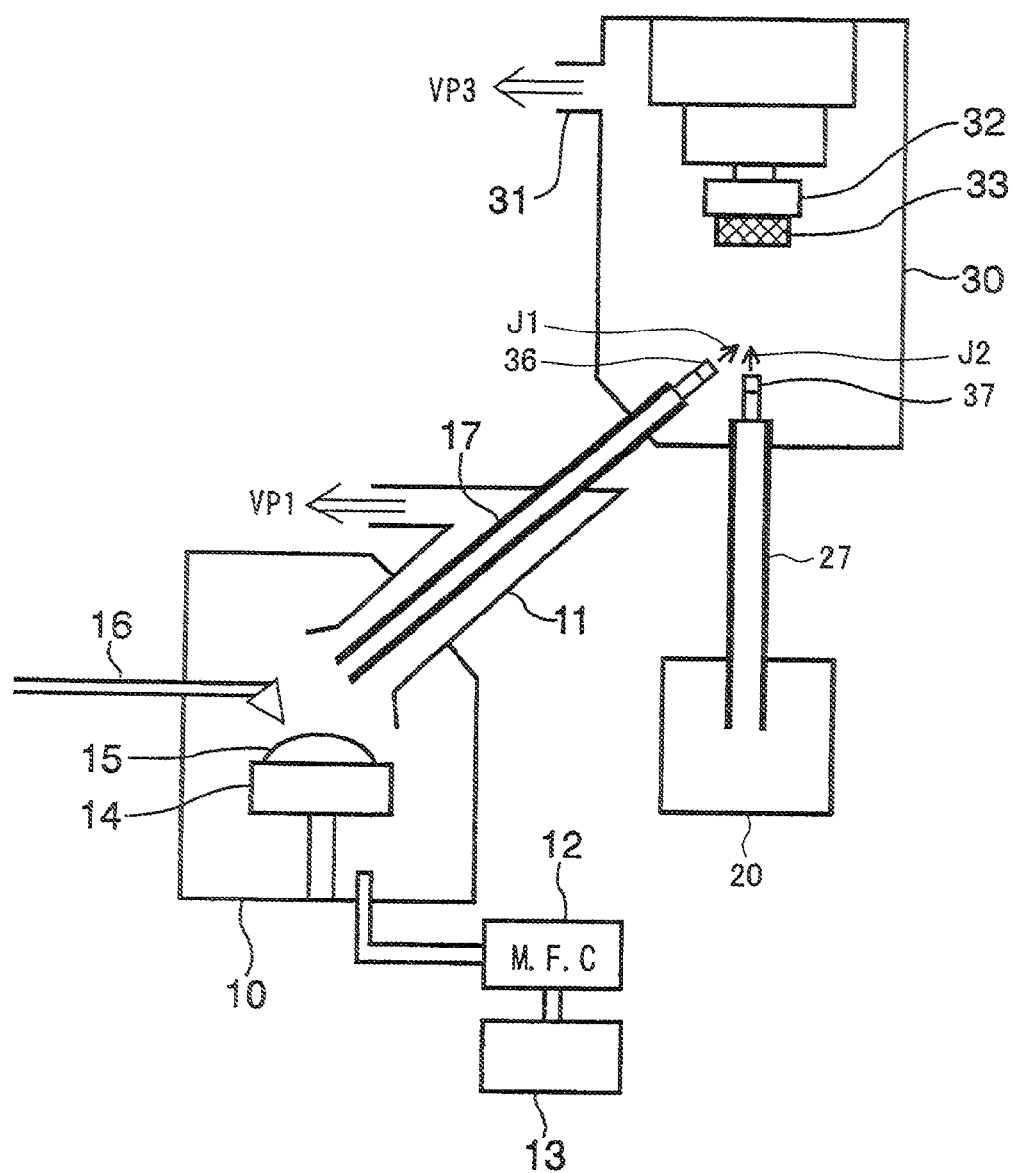
[FIG. 6]

FIG. 6 is a schematic view of the configuration of an SFJ-PVD apparatus as the physical vapor deposition apparatus according to the present embodiment described above.

The SFJ-PVD apparatus of the present embodiment is provided with an evaporation chamber 10, a hydroxyapatite particle or other powder supply source 20, and a vacuum chamber for forming a film comprised of a film forming chamber 30.

In the evaporation chamber 10, an exhaust pipe 11 which is connected to a vacuum pump VP1 is provided. The interior of the evaporation chamber 10 is evacuated by operation of the vacuum pump V1 and is made an ultra-high vacuum atmosphere of for example about 10-10 Torr. Further, according to need, to the evaporation chamber 10, He, Ar, N2, or another inert gas is supplied from a gas supply source 13 provided via a mass flow controller 12 with a predetermined flow rate. The interior of the evaporation chamber 10 is made a predetermined pressure a atmosphere. Alternatively, the interior may be made an air atmosphere.

A copper crucible 14 which is cooled by water is provided in the evaporation chamber 10. An evaporation source material 15 of a metal which forms a metal film is charged in this. A heating part 16 such as an arc torch or plasma torch is provided in the vicinity of the evaporation source material 15. The evaporation source material 15 is heated by the heating part 15 to evaporate, whereby fine particles having sizes of nanometer order (nanoparticles) are obtained from atoms evaporated from the evaporation source material 15.

As the metal which becomes the evaporation source material, for example, titanium can be preferably used.

The obtained fine particles (nanoparticles) are transported together with the inert gas it the evaporation chamber 10 to the film forming chamber 30 through the transport pipe 17.

In the film forming chamber 30, an exhaust pipe 31 connected to a vacuum pump VP3 is provided. The interior the film forming chamber 30 is evacuated by operation of the vacuum pump V3 and is made an ultra-high vacuum atmosphere of for example about 10-10 Torr.

A supersonic nozzle (Laval nozzle) 36 is provided at the front end of the transport pipe 17 from the evaporation chamber 10. A not shown coil heater may also be provided at the outer periphery of the transport pipe 17 to make enable heating.

Between the above evaporation chamber 10 and film forming chamber 30, a flow of gas occurs due to a pressure difference, so the fine particles (nanoparticles) are transported together with the inert gas through the transport pipe 17 to the film forming chamber 30 and are sprayed as a supersonic gas stream (stream of supersonic free jet) J1 from the supersonic nozzle 36 attached to the front end of the transport pipe 17 into the film forming chamber 30 toward the substrate for film formation 33.

On the other hand, the powder supply source 20 contains hydroxyapatite particles or other powder. The pressure in the vessel configuring the powder supply source 20 is not particularly limited, but preferably is the air atmosphere from the viewpoint of operability.

When hydroxyapatite particles are used, use can be made of commercially available ones. The particle size of the hydroxyapatite particles is for example tens of micrometers or less, preferably about 0.1 to 10 μm. For example, the particle size distribution is about 0.7 to 3 µm. Further, preferably use is made of particles having a hexagonal crystal structure.

For example, by making the vessel of the powder supply source 20 or the like vibrate, the powder-state powder is stirred up in the vessel. The stirred up powder is transported together with the inert gas in the vessel through the transport pipe 27 to the film forming chamber 30.

Between the above powder supply source 20 and film forming chamber 30, a flow of gas occurs due to a pressure difference, so the powder is transported together with the inert gas through the transport pipe 27 to the film forming chamber 30 and is sprayed as a supersonic gas stream (stream of supersonic free jet) J2 from the supersonic nozzle 37 attached to the front end of the transport pipe 27 into the film forming chamber 30 toward the substrate for film formation 33.

In the film forming chamber 30, a stage driven in the X-Y direction is provided, a substrate holder 32 having an electrical resistance heating system is connected to this stage, and the substrate 33 for film formation is fixed. The temperature of the substrate 33 is measured by a not shown thermocouple at a point close to the film forming region of the substrate 33 and is fed back to the electrical resistance heating system so as to enable the temperature to be controlled.

The substrate for film formation is not particularly limited, but use can be made of for example a pure titanium sheet (JIS grade 1 or 2), A1050 aluminum alloy sheet, SUS304 stainless steel sheet, etc. The substrate for film formation is preferably used after cleansing by supersonic waves in acetone before being set in the film forming chamber.

Further, the film forming region of the substrate is set to for example 5 to 7 mm square.

The supersonic nozzles (36, 37) are designed based on the one-dimensional or two-dimensional compressible fluid dynamics in accordance with the type and composition of the gas and the exhaust capability of the film forming chamber and are connected to the front ends of the transport pipes (17, 27) or formed integrally with the front end portions of the transport pipes.

The fine particles (nanoparticles) are for example accelerated up to a supersonic speed of about Mach 4.2 by the supersonic nozzle 36, ride the supersonic gas stream J1, are sprayed into the film forming chamber 30, and are deposited on the substrate for film formation 33 (physical vapor deposition).

The powder is for example accelerated up to a supersonic speed of about Mach 4.2 by the supersonic nozzle 37, rides the supersonic gas stream 52, is sprayed into the film forming chamber 30, and is deposited on the substrate for film formation 33 (physical vapor deposition).

As described above, a dispersion film having a structure as shown in FIG. 5 can be formed on the substrate 33.

The deposition of the metal particles and the deposition of the powder described above may be carried out simultaneously, sequentially, or alternately.

Below, a physical vapor deposition method in the present embodiment according to the present invention will be, explained.

FIG. 7 is a flow chart of the physical vapor deposition method in the present embodiment according to the present invention.

Fine particles (nanoparticles) are produced from the evaporation source material (ST10).

The crucible 14 is provided in the evaporation chamber 10, while the evaporation source material 15 is charged in this. Then, in the vicinity of the evaporation source material 15, the heating part 16 comprised of an arc torch is provided. By making this crucible 14 an anode electrode and making the arc torch a cathode electrode and running a DC current, an arc is generated due to discharge between the two electrodes. The evaporation source material 15 is evaporated by that heat. By evaporation of the evaporation source material 15, the evaporation source material 15 becomes atoms, and nanoparticles are generated from these atoms.

Next, the fine particles (nanoparticles) and the powder are sprayed from the supersonic nozzles (ST21).

The gas which was produced at step ST10 and contains nanoparticles is transported from the inside of the evaporation chamber by the transport pipe 17 and is sprayed from the supersonic nozzle 36 provided at the front end of the transport pipe 17 into the film forming chamber 30 due to the pressure difference between the film forming chamber 30 having an ultra-high vacuum atmosphere and the transport pipe 17.

Further, the powder supply source 20 contains the powder. The powder is stirred up in the vessel by for example making the vessel of the powder supply source 20 vibrate. The gas containing the stirred up powder is transported from the powder supply source 20 by the transport pipe 27 and is sprayed from the supersonic nozzle 37 provided on the front end of the transport pipe 27 into the film forming chamber 30 due to the pressure difference between the film forming chamber 30 and the transport pipe 27.

Next, the fine particles (nanoparticles) and powder are deposited on the substrate for film formation (ST30).

The gas containing nanoparticles and the gas containing a powder sprayed as described above impinge upon the substrate for film formation 33, whereby a film of the nanoparticles and powder is formed on the substrate for film formation 33.

According to the physical vapor deposition apparatus and method of the present embodiment, a substance which is hard to form into fine particles even when it is heated by plasma, arc discharge, or the like can be processed to form a film.

Further, according to the physical vapor deposition apparatus and method of the present embodiment, a film can be formed by mixing a substance, which would exhibit brittleness if forming a film solo, with another substance.

Further, according to the physical vapor deposition apparatus and method of the present embodiment, when forming a film by mixing a plurality of materials, the film can be formed without using a plurality of vacuum vessels and heating devices.

Example 1

By using an SFJ-PVD apparatus shown in FIG. 6, as shown in the hove embodiment, a titanium film and a hydroxyapatite particle-dispersed titanium film having hydroxyapatite particles dispersed in titanium film were formed on a titanium substrate.

Titanium sheets of 20 mm×20 mm×1 mm (JIS grade 2, 0.20 of Ti, 0.15 of Fe, 0.13 of O, and 0.05 of N; wt %) were used as the substrates. A 5 mm square was refined as the film forming region. All substrates were cleansed by supersonic waves in acetone before being set into the film forming chamber. The substrate temperature at the time of the film formation was controlled to 423K.

Further, pure titanium was used as the evaporation source of the evaporation chamber, the internal portion of the evaporation chamber was made an He atmosphere of 80 kPa, and titanium particles were produced by arc plasma. The temperature of the supersonic nozzle for placing the titanium particles on the supersonic gas stream and spraying them was controlled to 873K.

In the powder supply source, hydroxyapatite particles having a particle size distribution of 0.7 to 3 μm (ECCERA Co., Ltd., 36% of Ca, 17% of P, 690 mg of Mg, 760 mg of Na, 16 mg of K, 15 mg of Fe, 9.2 ppm of Zn, 90 ppm of Ba) were contained, He was used as a carrier gas, the carrier as gas flow rate was controlled to 0 to 4.25 SLM, and the vibration applied to the powder supply source was set to 0 to 1200 rpm.

The thickness of the obtained hydroxyapatite particle-dispersed titanium film was about 50 to 70 μm, and the composition was hydroxyapatite:titanium=about 3:7.

FIG. 8A is an electronic micrograph capturing the entire film forming region of the hydroxyapatite particle-dispersed titanium film formed as described above, while FIG. 8B is an electron micrograph taken while magnifying the surface of the same film.

A state where hydroxyapatite particles are embedded in the metal film which becomes a binder can be observed.

Example 2

Figure 9A:
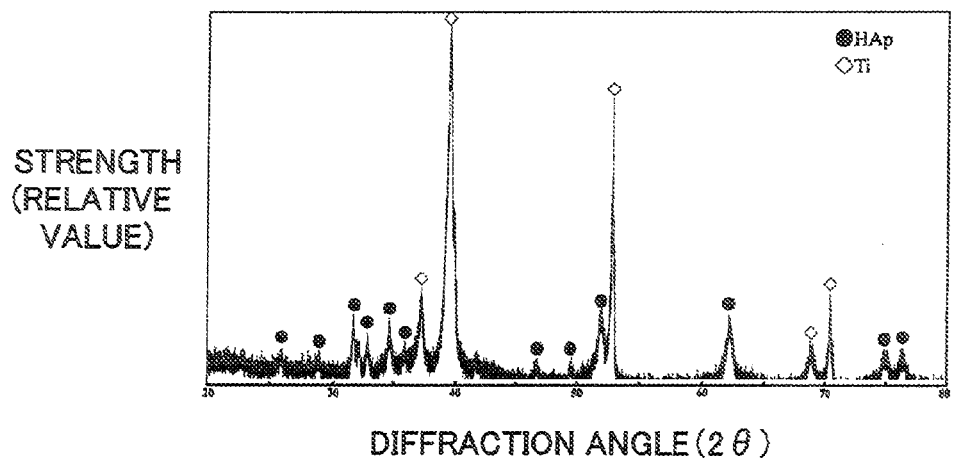
FIG. 9A and FIG. 9B are X-ray diffraction profiles according to Example 2.
Figure 9B:
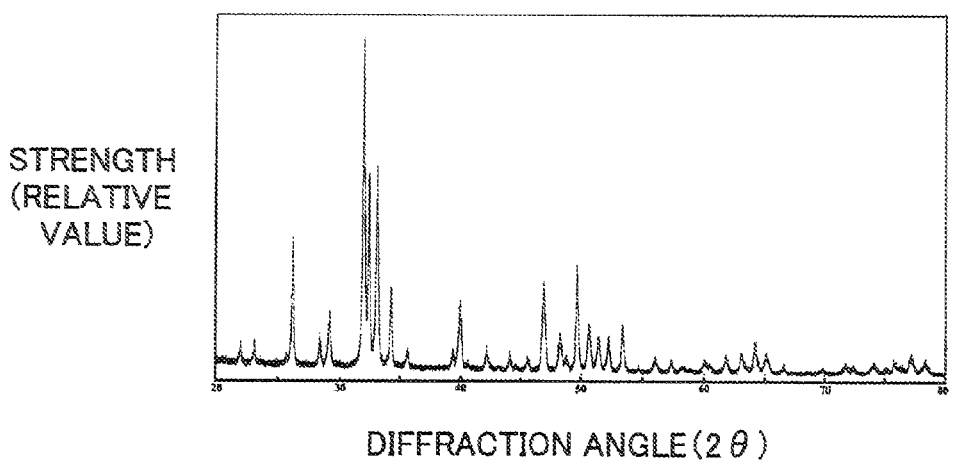

FIG. 9A is an X-diffraction profile of a hydroxyapatite particle-dispersed titanium film prepared in Example 1. Further, FIG. 9B is an X-diffraction profile of the powder of hydroxyapatite particles.

As shown in FIG. 9A, peaks indicated by black circles belong to hydroxyapatite (HAp), and peaks indicated by white circles belong to metal titanium (Ti). Namely, the peaks of hydroxyapatite and titanium were observed. The film was confirmed to be a dispersion film in which hydroxyapatite particles were dispersed in a titanium film.

Example 3

An experiment on a titanium substrate dipping a substrate on which a hydroxyapatite-dispersed titanium film formed as described above was formed in a simulated body fluid was carried out, and the state of precipitation of hydroxyapatite was observed.

Here, as the simulated body fluid, use was made of the SBF (simulated body fluid) disclosed in the document T. Kokubo and H. Takadama, How useful is SBF in predicting in vivo bone bioactivity?, Biomater., 2006, 27, p. 2907 to 2915. Namely, it is a solution obtained by dissolving NaCl, NaHCO3, KCl, K2HPO4.3H2O, MgCl2.6H2O, HCl, CaCl2, Ne2SO4, etc. in distilled ion exchanged water and adjusting it by 1M HCl to 7.4 pH. It has a composition near human serum. The temperature of SBF was set to 310K, and the dipping time was set to 7 days to 14 days.

Figure 10A:
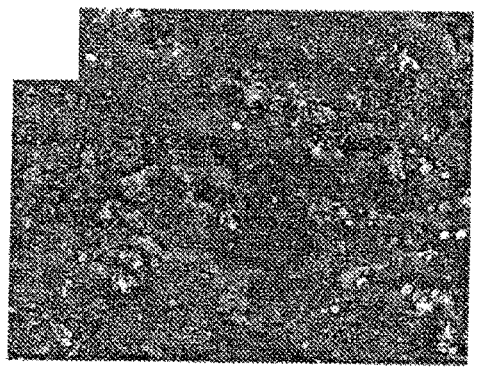
FIG. 10A to FIG. 10D are electron micrographs according to Example 3.
Figure 10B:
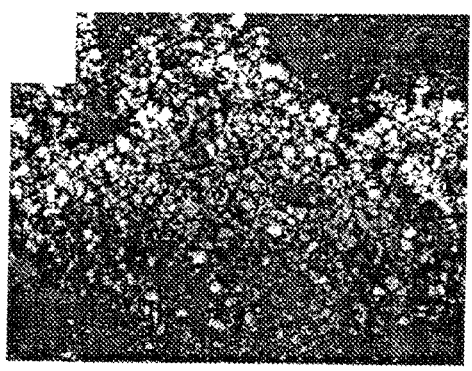
Figure 10C:
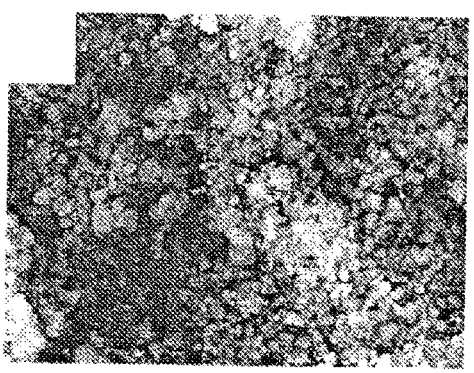
Figure 10D:
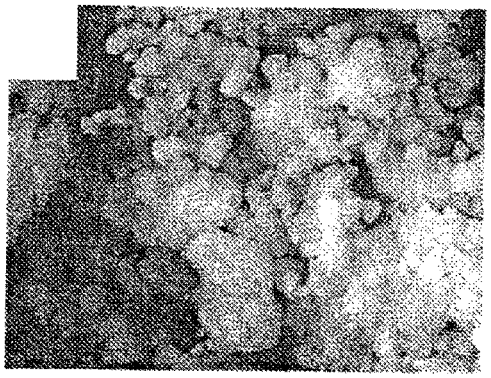

FIG. 10A to FIG. 10C are electron micrographs of the surface of the hydroxyapatite particle-dispersed titanium film, in which FIG. 10A shows the state before dipping in SBF, FIG. 10B shows the state seven days after dipping in SBF, and FIG. 10C shows the state 14 days after dipping in SBF. Further, FIG. 10D is a photograph magnifying a portion of FIG. 10C.

After dipping for seven days, a situation where the surface of the hydroxyapatite particle-dispersed titanium film became rough and particles of bone-like apatite were precipitated was observed.

After dipping for 14 days, particles of bone-like apatite further grew and the density became high as well.

The growth of the bone ô like apatite as described above is a phenomenon which is not seen in an ordinary titanium film. It is considered that the hydroxyapatite particle-dispersed titanium film according to the present embodiment provides nucleus-forming sites where a surface energy for forming the bone-like apatite is low and induces the growth of the bone-like apatite.

By forming the hydroxyapatite particle-dispersed metal film according to the SFJ-PVD method, the following effects can be enjoyed.

(1) A dense hydroxyapatite particle-dispersed metal film free from voids and cracks can be formed.

(2) By controlling the flow rate etc. of the metal particles and hydroxyapatite particles, a weight ratio between the metal portion and hydroxyapatite particle portion in the hydroxyapatite particle-dispersed metal film can be selected.

The present invention is not limited to the above explanation.

For example, the fine particles (nanoparticles) are not limited to titanium. The invention can be applied to other metal fine particles or still other fine particles. Further, the powder is not limited to hydroxyapatite particles. The invention can be applied to other ceramic powders or still other powders.

Other than those, various modifications are possible within a range not out of the gist of the present invention.

Industrial Applicability

The physical vapor deposition apparatus and method the present invention can be applied to a method of mixing metal and other fine particles with a powder to form a film.

The invention claimed is:

1. A physical vapor deposition method, including:
   a production step of heating and evaporating an evaporation source material in a predetermined gas atmosphere or an air atmosphere in an evaporation chamber by a heating part which evaporates the evaporation source material to produce fine particles from evaporated atoms;
   a stirring step of stirring a powder having a particle size of not more than several tens of micrometers in a vessel of a powder supply source by causing the vessel to vibrate at not more than 1200 rpm;
   a mixing step of transporting the fine particles and the powder from the powder supply source to a mixing part and mixing the fine particles and the powder in the mixing part, wherein the transporting is caused by a pressure difference between the evaporation chamber and the powder supply source and a film forming chamber; and
   a film forming step of making the mixed fine particles and powder ride a supersonic gas stream created by a supersonic nozzle connected to the mixing part, depositing this on the substrate for film formation by physical vapor deposition, and forming a film containing the fine particles and the powder in the film forming chamber.

2. A physical vapor deposition method as set forth in claim 1, wherein the fine particles are made of metal.

3. A physical vapor deposition method as set forth in claim 1, wherein the powder is made of ceramic.

4. A physical vapor deposition method as set forth in claim 2, wherein the powder is made of ceramic.

* * * * *